United States Patent
Bretthauer et al.

(10) Patent No.: US 11,962,973 B2
(45) Date of Patent: Apr. 16, 2024

(54) COMBINED CORRUGATED PIEZOELECTRIC MICROPHONE AND CORRUGATED PIEZOELECTRIC VIBRATION SENSOR

(71) Applicant: Infineon Technologies AG, Neubiberg (DE)

(72) Inventors: Christian Bretthauer, Munich (DE); David Tumpold, Kirchheim beim München (DE); Pradyumna Mishra, San Jose, CA (US); Daniel Neumaier, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/165,014

(22) Filed: Feb. 6, 2023

(65) Prior Publication Data
US 2023/0188899 A1 Jun. 15, 2023

Related U.S. Application Data

(62) Division of application No. 16/896,665, filed on Jun. 9, 2020, now Pat. No. 11,611,835.

(51) Int. Cl.
*H04R 17/02* (2006.01)
*B81B 7/04* (2006.01)
(Continued)

(52) U.S. Cl.
CPC ............ *H04R 17/02* (2013.01); *B81B 7/04* (2013.01); *G01H 11/08* (2013.01);
(Continued)

(58) Field of Classification Search
CPC .... B81B 2201/0235; B81B 2201/0257; B81B 2203/0127; B81B 7/04; G01H 11/08;
(Continued)

(56) References Cited

U.S. PATENT DOCUMENTS 5,365,799 A 11/1994 Okada
5,492,020 A 2/1996 Okada
(Continued)

FOREIGN PATENT DOCUMENTS

DE 69124377 T2 6/1997
DE 102006062314 A1 7/2008
(Continued)

OTHER PUBLICATIONS

Sean Cashin, Differential input to differential output circuit using a fully-differential amplifier, Texas Instruments, Analog Engineer's Circuit: Amplifiers SBOA331—Jan. 2019 (Year: 2019).*
(Continued)

*Primary Examiner* — David L Singer
(74) *Attorney, Agent, or Firm* — Slater Matsil, LLP (57) ABSTRACT

A combined MicroElectroMechanical structure (MEMS) includes a first piezoelectric membrane having one or more first electrodes, the first piezoelectric membrane being affixed between a first holder and a second holder; and a second piezoelectric membrane having an inertial mass and one or more second electrodes, the second piezoelectric membrane being affixed between the second holder and a third holder.

21 Claims, 10 Drawing Sheets

(51) Int. Cl.
| | |
|---|---|
| *G01H 11/08* | (2006.01) |
| *G01P 1/02* | (2006.01) |
| *G01P 15/08* | (2006.01) |
| *G01P 15/09* | (2006.01) |
| *G01P 15/18* | (2013.01) |
| *H04R 1/04* | (2006.01) |
| *H04R 1/28* | (2006.01) |
| *H10N 30/30* | (2023.01) |
| *H10N 30/87* | (2023.01) |
| *H04R 7/18* | (2006.01) |
| *H04R 17/10* | (2006.01) |

(52) U.S. Cl.
CPC .......... *G01P 15/0802* (2013.01); *G01P 15/09* (2013.01); *G01P 15/18* (2013.01); *H04R 1/28* (2013.01); *H10N 30/302* (2023.02); *H10N 30/308* (2023.02); *H10N 30/87* (2023.02); B81B 2201/0235 (2013.01); B81B 2201/0257 (2013.01); B81B 2203/0127 (2013.01); *G01P 1/023* (2013.01); *G01P 2015/084* (2013.01); *H04R 1/04* (2013.01); *H04R 7/18* (2013.01); *H04R 17/10* (2013.01); H04R 2201/003 (2013.01)

(58) Field of Classification Search
CPC ...... G01P 1/023; G01P 15/0802; G01P 15/09; G01P 15/18; G01P 2015/084; H01L 41/047; H01L 41/1132; H01L 41/1138; H04R 1/04; H04R 1/28; H04R 17/02; H04R 17/10; H04R 2201/003; H04R 2410/03; H04R 7/18; H04R 7/26
See application file for complete search history.

(56) References Cited

U.S. PATENT DOCUMENTS

| | | | | |
|---|---|---|---|---|
| 5,567,880 | A * | 10/1996 | Yokota | G01P 15/125 73/514.36 |
| 5,850,040 | A | 12/1998 | Okada | |
| 5,959,209 | A | 9/1999 | Takeuchi et al. | |
| 6,435,000 | B1 | 8/2002 | Takahashi et al. | |
| 6,474,134 | B1 | 11/2002 | Takahashi et al. | |
| 6,508,127 | B1 | 1/2003 | Namerikawa et al. | |
| 6,546,800 | B1 | 4/2003 | Namerikawa et al. | |
| 9,661,411 | B1 | 5/2017 | Han et al. | |
| 2004/0020292 | A1 | 2/2004 | Deng | |
| 2004/0027033 | A1 | 2/2004 | Schiller | |
| 2004/0123663 | A1 * | 7/2004 | Saitoh | G01P 1/023 73/514.36 |
| 2004/0159166 | A1 | 8/2004 | Schiller | |
| 2004/0221651 | A1 | 11/2004 | Schiller | |
| 2004/0226373 | A1 * | 11/2004 | Sakaguchi | G01P 15/123 73/488 |
| 2006/0272413 | A1 | 12/2006 | Vaganov et al. | |
| 2007/0277607 | A1 * | 12/2007 | Ino | G01P 15/18 73/514.16 |
| 2008/0034867 | A1 * | 2/2008 | Kazama | G01P 15/18 73/514.33 |
| 2008/0178675 | A1 | 7/2008 | Okada | |
| 2008/0192963 | A1 * | 8/2008 | Sato | H04R 19/04 381/174 |
| 2008/0205668 | A1 * | 8/2008 | Torii | H04R 19/005 381/113 |
| 2010/0300205 | A1 * | 12/2010 | Kazama | G01P 15/0802 73/514.36 |
| 2011/0123052 | A1 * | 5/2011 | Bominaar-Silkens | H04R 3/002 381/174 |
| 2011/1059627 | | 6/2011 | Mantravadi et al. | |
| 2011/0174076 | A1 | 7/2011 | Classen et al. | |
| 2012/0033832 | A1 * | 2/2012 | van Lippen | H04R 1/245 381/111 |
| 2012/0227488 | A1 | 9/2012 | Lim et al. | |
| 2012/0276674 | A1 | 11/2012 | Mehregany | |
| 2012/0299130 | A1 | 11/2012 | Langereis et al. | |
| 2013/0001550 | A1 * | 1/2013 | Seeger | B81C 99/0045 438/15 |
| 2013/0241012 | A1 * | 9/2013 | Pruemm | H01L 21/76898 438/51 |
| 2013/0264663 | A1 | 10/2013 | Dehe et al. | |
| 2014/0264656 | A1 * | 9/2014 | Ata | H04R 19/005 257/416 |
| 2015/0158722 | A1 * | 6/2015 | Lim | G01L 23/125 438/51 |
| 2015/0276529 | A1 | 10/2015 | Wiesbauer et al. | |
| 2016/0340173 | A1 | 11/2016 | Klein et al. | |
| 2017/0026754 | A1 | 1/2017 | Buck et al. | |
| 2017/0078802 | A1 | 3/2017 | Ravnkilde et al. | |
| 2017/0156002 | A1 * | 6/2017 | Han | H04R 31/006 |
| 2018/0035229 | A1 | 2/2018 | Deas et al. | |
| 2018/0099867 | A1 | 4/2018 | Walther et al. | |
| 2019/0016588 | A1 | 1/2019 | Bretthauer et al. | |
| 2019/0289405 | A1 | 9/2019 | Littrell et al. | |
| 2020/0196065 | A1 | 6/2020 | Pedersen et al. | |
| 2020/0245053 | A1 * | 7/2020 | Pedersen | H04R 31/006 |
| 2021/0382085 | A1 | 12/2021 | Bretthauer et al. | |
| 2021/0385584 | A1 | 12/2021 | Bretthauer et al. | |

FOREIGN PATENT DOCUMENTS

| | | |
|---|---|---|
| DE | 102015213774 A1 | 1/2017 |
| JP | H1026571 A | 1/1998 |
| JP | H10170538 A | 6/1998 |
| JP | H10170540 A | 6/1998 |
| JP | H10332503 A | 12/1998 |
| JP | 2000275126 A | 10/2000 |

OTHER PUBLICATIONS

Google, "Pixel Buds 2", Google's new Pixel Buds are coming spring 2020, https://www.theverge.com/2019/10/15/20891651/new-google-pixel-buds-2-2019-wireless-features-bluetooth-price-release-date, Oct. 15, 2019, 4 pages.

Liu, Jian et al., "Nonlinear model and system identification of a capacitive dual-backplate MEMS microphone", Elsevier, ScienceDirect, Journal of Sound and Vibration, 309, Sep. 14, 2007, 17 pages.

Sonion, "Humanizing the Digital Experience", TDK Developers Conference, Sep. 17-18, 2018, Santa Clara Marriott, US, 37 pages.

* cited by examiner

COMBINED CORRUGATED PIEZOELECTRIC MICROPHONE AND CORRUGATED PIEZOELECTRIC VIBRATION SENSOR

This application is a divisional application of U.S. patent application Ser. No. 16/896,665, filed Jun. 9, 2020, which application is hereby incorporated herein by reference.

TECHNICAL FIELD

The present invention relates generally to a combined corrugated piezoelectric microphone and corrugated piezoelectric vibration sensor.

BACKGROUND

Microelectromechanical transducers play a central role in modern electronics both as sensors and also as actuators and are used in a multiplicity of different applications, for example as microphones, loudspeakers, pressure sensors or acceleration sensors.

Microelectromechanical transducers can have a membrane, which can be displaced in a passive or active manner depending on whether the transducers are formed as sensors or actuators. In the case of a microelectromechanical transducer formed as a sensor, the membrane can be displaceable in a passive manner, for example by sound to be detected or an acceleration to be detected. Characteristics of the variable to be detected, such as a sound frequency, a sound amplitude or a temporal acceleration profile, can be ascertained from a displacement of the membrane. In the case of a microelectromechanical transducer formed as an actuator, the membrane can be displaced in an active manner, for example in order to generate sound in a loudspeaker.

Such membranes of microelectromechanical transducers can be formed at least in sections from a piezoelectric material, in which, in the case of a passive displacement of the membrane, a voltage is induced, which can be read out by a suitable read-out circuit in order to ascertain characteristics of a variable to be detected. Alternatively, in the case of an actuator, a voltage can be applied to the membrane in order to bring about a targeted deformation of the membrane, for example in order to generate sound.

SUMMARY

In an embodiment, a combined MEMS structure includes a first piezoelectric membrane including one or more first electrodes, the first piezoelectric membrane being affixed between a first holder and a second holder; and a second piezoelectric membrane including an inertial mass and one or more second electrodes, the second piezoelectric membrane being affixed between the second holder and a third holder.

In another embodiment, a packaged MEMS structure includes a substrate including a sound port, and a contact pad; a first piezoelectric membrane including one or more first electrodes, the first piezoelectric membrane being affixed between a first holder and a second holder; a second piezoelectric membrane including an inertial mass and one or more second electrodes, the second piezoelectric membrane being affixed between the second holder and a third holder, wherein the first, second, and third holders are secured to the substrate; an amplifier having first and second inputs coupled to the one or more first electrodes and the one or more second electrodes and an output coupled to the contact pad; and a housing secured to the substrate, enclosing the first piezoelectric membrane, the second piezoelectric membrane, and the amplifier.

In another embodiment, a MEMS accelerometer includes a piezoelectric membrane including at least one electrode and an inertial mass, the piezoelectric membrane being affixed to a holder; and a circuit configured for evaluating sums and differences of signals associated with the at least one electrode to determine a three-dimensional acceleration direction.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

One or more corrugated piezoelectric membranes are used in a combined microelectricalmechanical system (MEMS) device having a corrugated piezoelectric microphone and a corrugated piezoelectric vibration sensor (transducers). The combined MEMS device can be packaged together with an amplifier or other processing circuitry. The corrugated piezoelectric membrane technology described below is used to provide a robust, stable, manufacturable, and economical MEMS device. In an embodiment, the combination of a corrugated piezoelectric microphone and a piezoelectric membrane based vibration sensor with a center mass can be advantageously manufactured in the same technology and therefore also on the same wafer. In an embodiment, the center mass of the vibration sensor can be formed of bulk silicon, thin film structures, or both. Since the readout principle for both transducers is the same both devices can therefore use the same or similar application-specific integrated circuits (ASICs) or analog frontend circuits, or even share a state-of-the art differential analog microphone ASIC, in embodiments. In the case of using only one single analog differential microphone-ASIC, one sense channel reads the microphone as a single-ended input and the other channel reads the vibration sensor in parallel, also as a single-ended input. The ASIC can thus be cost effective and re-used from existing products. These, and other aspects of embodiments of the present invention are described in further detail below.

Figure 1:
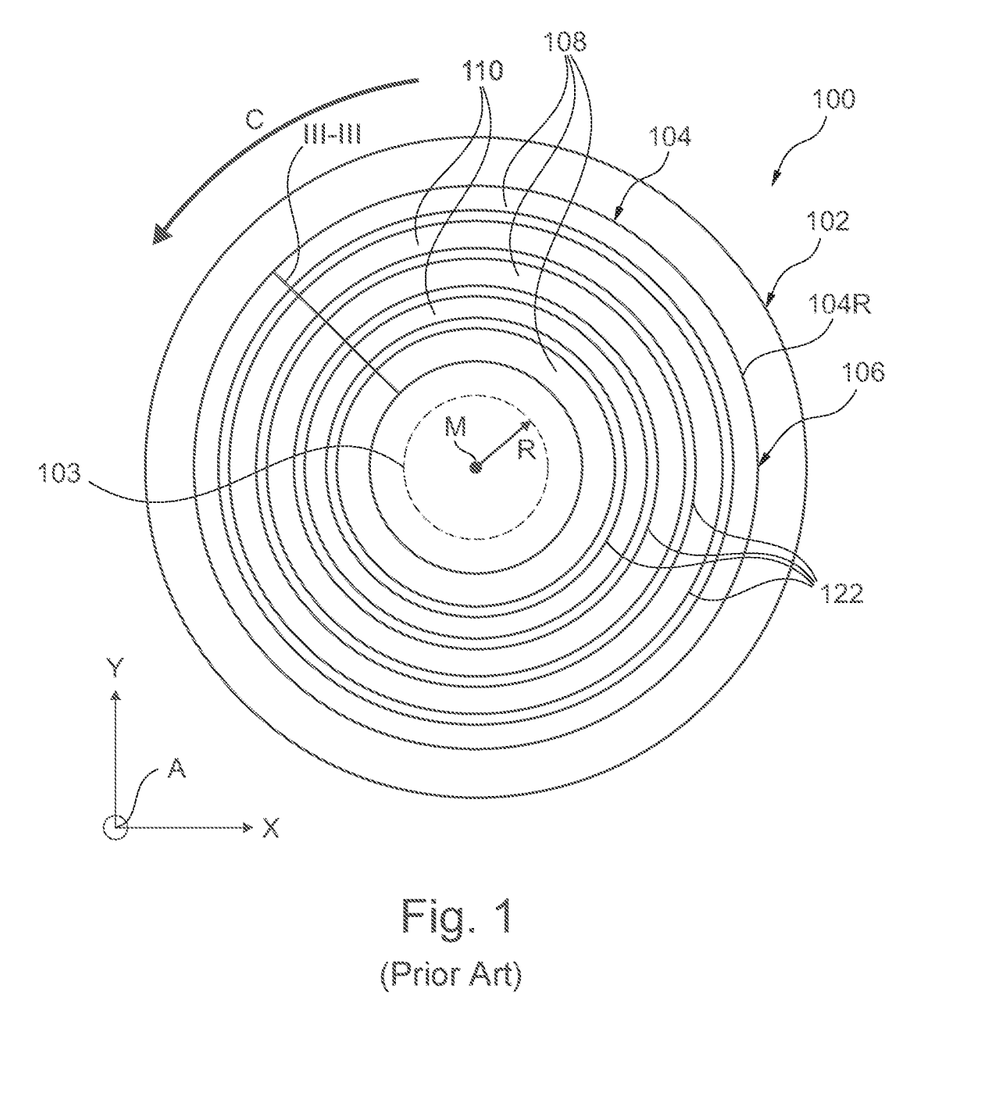
FIG. 1 is a plan view of an exemplary piezoelectric membrane of a microelectromechanical transducer.

FIG. 1 illustrates an exemplary microelectromechanical transducer 100. Microelectromechanical transducer 100 can have a holder 102 and a displaceable membrane 104 secured to the holder 102. At least a part of the membrane 104 can be formed from piezoelectric material. A voltage, which can be measured by a suitable read-out circuit, can be induced in the piezoelectric material by a displacement of the membrane 104. Characteristics of a variable to be detected, such as, for example, sound to be detected or an acceleration to be detected, can be ascertained from the measured voltage. Alternatively, a voltage can be applied to the membrane 104 in order to displace the membrane 104, for example in order to generate sound.

If the transducer 100 is formed as an acceleration sensor or as part of an acceleration sensor, an inertial mass 103 can be provided on the membrane 104, for example on a central section of the membrane 104, in order to increase a force exerted on the membrane 104 by an acceleration to be detected. The inertial mass 103 can be formed separately from the membrane 104. Said inertial mass can be formed, for example, from a semiconductor material, such as silicon.

As indicated in FIG. 1, the membrane 104 can be secured at its edge region 104R in a circumferential manner to the holder 102. The membrane 104 can be formed as a closed component so that an interruption-free connection exists along the membrane 104 between two arbitrary points of the edge region 104R of the membrane 104. The membrane 104 can consequently be formed in a manner free of fluid passage openings, which can otherwise act as a source of noise when fluid such as, for example, a gas flows through such a fluid passage opening. The lack of a fluid passage opening in the membrane 104 can constitute a considerable advantage over a piezoelectric membrane that has a plurality of cantilevers, which can be deflected independently of one another. A closed membrane 104 is also particularly robust, since any cantilevers react in a particularly sensitive manner to extreme mechanical loadings, which can lead to damage of a membrane having cantilevers, for example in the event of an impact. However, this does not exclude a membrane 104 described here from being able to have one or more openings in order to minimize a resistance, which can be caused by gas, for example air, collected on a side of the membrane 104. This can ensure a high degree of resilience of the membrane 104.

The membrane 104 shown in FIG. 1 can be formed as a planar component. The term "planar" essentially means that the membrane 104 has a substantially greater extent along a first spatial direction X and a second spatial direction Y orthogonal to the first spatial direction X than along a third spatial direction, which is orthogonal to the first spatial direction X and to the second spatial direction Y and defines an axial direction A of the membrane 104.

The membrane 104 can have an undulated section 106 comprising at least one undulation peak 108 and at least one undulation trough 110 or comprising a plurality of undulation peaks 108 and a plurality of undulation troughs 110. The undulation peaks 108 and the undulation troughs 110 are arranged consecutively in a radial direction R of the membrane 104 in alternating fashion. The undulation peaks 108 or/and the undulation troughs 110 can have a circular or circular-segment-shaped design and be arranged concentrically, for example around a center point M of the membrane 104. A circular-segment-shaped configuration of the undulation peaks 108 and undulation troughs 110 (not shown) permits, for example, a radial laying of feed lines on the membrane 104.

Due to a circular or circular-segment-shaped formation of the undulation peaks 108 or/and undulation troughs 110, the membrane 104 is primarily set up to detect a deflection in the circumferential direction C.

The mechanical stresses discussed above can be compensated for by the provision of the undulated section 106 since the undulated section 106 can function as an elastic element, which can absorb the mechanical stresses discussed at the beginning by extension or compression, as a result of which a deformation of the membrane 104 caused by the mechanical stresses can be limited. This can ensure that the membrane 104 has a well-defined design and is consequently deflected in a well-defined manner, as a result of which reproducible behavior can be achieved.

Furthermore, the undulated section 106 of the membrane 104 can be utilized to reduce or to eliminate the compensation of induced electrical fields discussed at the beginning. This is explained below with reference to FIG. 2, which shows a section through the membrane 104 along the line III-III shown in FIG. 1.

Figure 2:
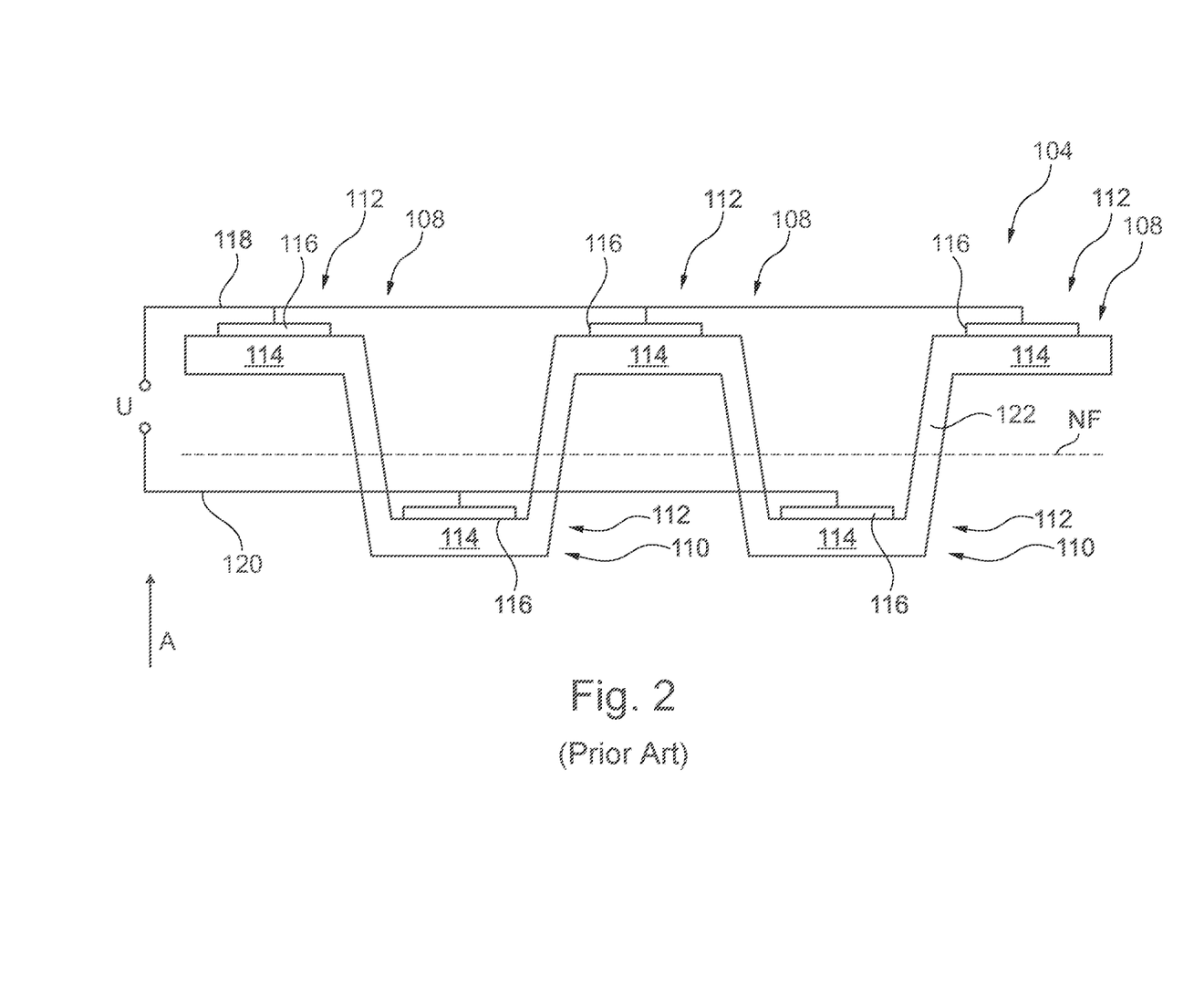
FIG. 2 is a cross-sectional view of a section of an exemplary piezoelectric membrane of a microelectromechanical transducer.

As shown in FIG. 2, a piezoelectric unit cell 112 can be provided in each case at a plurality of undulation peaks 108 or/and in a plurality of undulation troughs 110 or even at each undulation peak 108 or/and in each undulation trough 110, which piezoelectric unit cell has a piezoelectric layer 114 and at least one electrode 116 in electrical contact with the piezoelectric layer 114. In the undulated section 106, the neutral fiber NF of the membrane 104 is located in the axial direction A between the undulation peaks 108 and the undulation troughs 110. As a result of this, the membrane 104 is divided in the axial direction A by the neutral fiber NF into two regions, which, in the event of a deflection of the membrane 104, are subjected either to tensile loading or pressure loading. It is thus possible, for example, in the case of a deflection of the membrane 104, for the undulation peaks 108 to be subjected exclusively to tensile loading while the undulation troughs 110 can be subjected exclusively to pressure loading, and vice versa. This has the result that an electrical field with a consistent sign is induced in an undulation peak 108 or an undulation trough 110, so that, in contrast to the conventional piezoelectric membranes discussed at the beginning, no compensation of the electrical field within a piezoelectric layer 114 occurs, which would limit the net voltage that can be tapped. As a result of this, in the case of a prescribed deflection of the membrane 104, a voltage U that is higher compared to conventional piezoelectric transducers can ultimately be tapped, which makes a higher sensitivity compared to conventional microelectromechanical transducers possible. Furthermore, a defined deflection of the membrane 104 can be achieved by applying a voltage to the respective electrodes 116.

The piezoelectric unit cells 112 shown in FIG. 2 can have just one single electrode 116, which can be provided on the same side of the respective piezoelectric layers 114. This configuration can make the production of the microelectromechanical transducer 100 particularly simple since the electrodes 116 can be vapor-deposited or/and structured at the same time.

Substantially any electrically conductive material can be used as the material for the electrodes 116, for example a metal, such as aluminum. The piezoelectric layers 114 of the respective piezoelectric unit cells 112 can be produced, for example, from aluminum nitride (AlN), zinc oxide (ZnO) or lead zirconate titanate (PZT).

As indicated in FIG. 2, the electrodes 116 of the piezoelectric unit cells 112 provided at the undulation peaks 108 can be electrically connected in parallel with one another by a line 118, while the electrodes 116 of the piezoelectric unit cells 112 provided in the undulation troughs 110 can be electrically connected in parallel with one another by a line 120. In an embodiment, the electrodes 116 of the piezoelectric unit cells 112 can be electrically connected in series. As a result of this, the electrical potentials induced in the respective piezoelectric unit cells 112 at the undulation peaks 108 or in the undulation troughs 110 can be tapped by means of the respective electrodes 116 and subsequently summed, as a result of which a high net voltage U can be tapped.

The piezoelectric layers 114 of the respective piezoelectric unit cells 112 can be formed integrally with one another. As shown in FIGS. 1 and 2, the piezoelectric layers 114 of two adjacent piezoelectric unit cells 112 can be connected integrally to one another by connecting sections 122, which extend substantially in the axial direction A. Due to the integral formation of the piezoelectric layers 114, the membrane 104 can be produced in a simple manner overall, since, at the same time as the production of the undulated section 106, the piezoelectric layers 114 of the piezoelectric unit cells 112 can also be produced.

Figure 3:
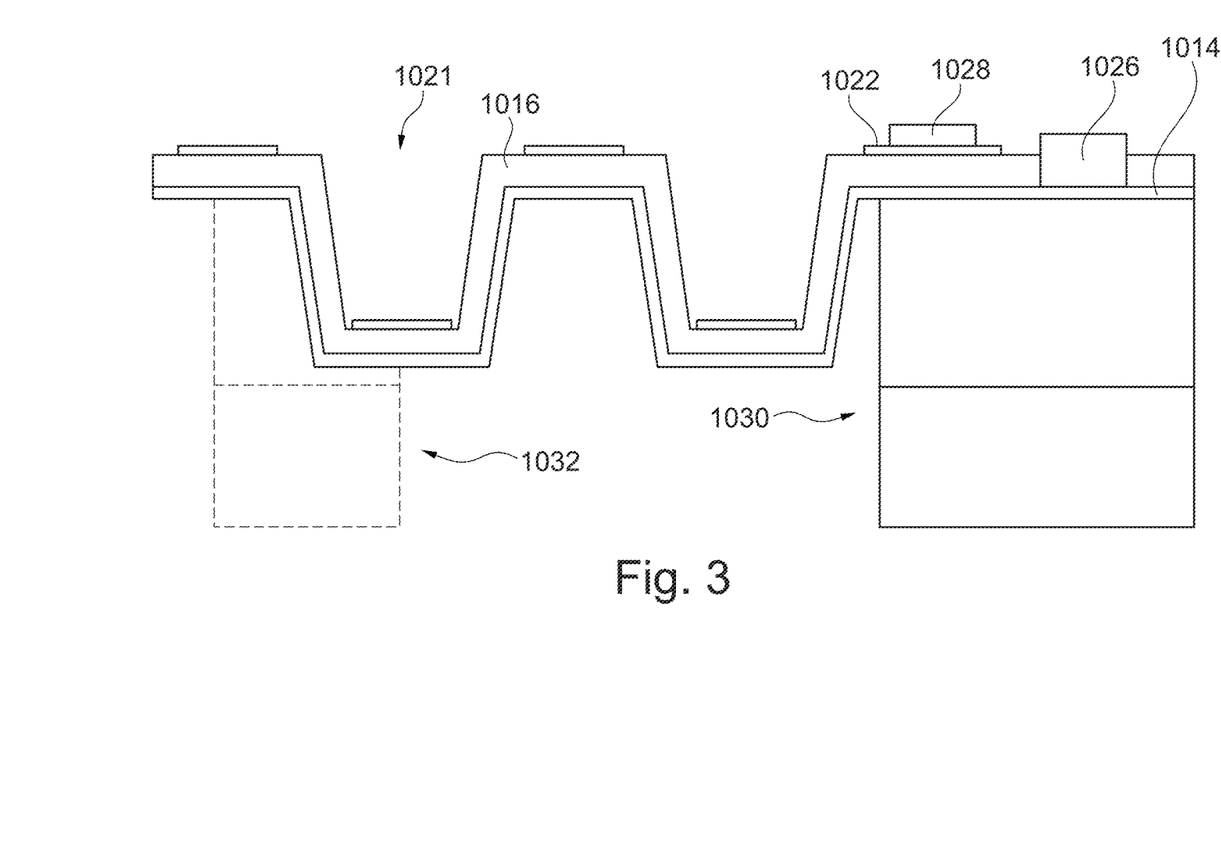
FIG. 3 is a cross-sectional view of a section of another exemplary piezoelectric membrane of a microelectromechanical transducer.

FIG. 3 shows a section of a corrugated piezoelectric membrane 1021 coupled to a holder 1030, which is not specifically shown in FIGS. 1 and 2. Corrugated piezoelectric membrane 1021 comprises an electrically conductive layer 1014, a piezoelectric layer 1016, an electrode 1022, a contact pad 1026, a contact pad 1028, a holder 1030, and an optional inertial mass 1032.

Contact pad 1026 is used for contacting the electrically conductive layer 1014, as shown in FIG. 3. Further contact pads 1028 can also be formed at the electrodes 1022 formed on the piezoelectric layer 1016 in order to electrically contact said piezoelectric layer. In the exemplary illustration according to FIG. 3, the inertial mass 1032 is provided on an undulated section of the membrane 1021. Said inertial mass can be provided in a central region of the membrane 1021, which central region is not undulated. FIG. 3 shows only a section of the membrane 1021, which has an undulated section and a region connected to the holder 1030 that is not undulated.

Further description of corrugated piezoelectric membranes can be found in co-pending U.S. Patent Application No. 2019/0016588, filed on Jul. 10, 2018, which is hereby incorporated by reference in its entirety.

Figure 4:
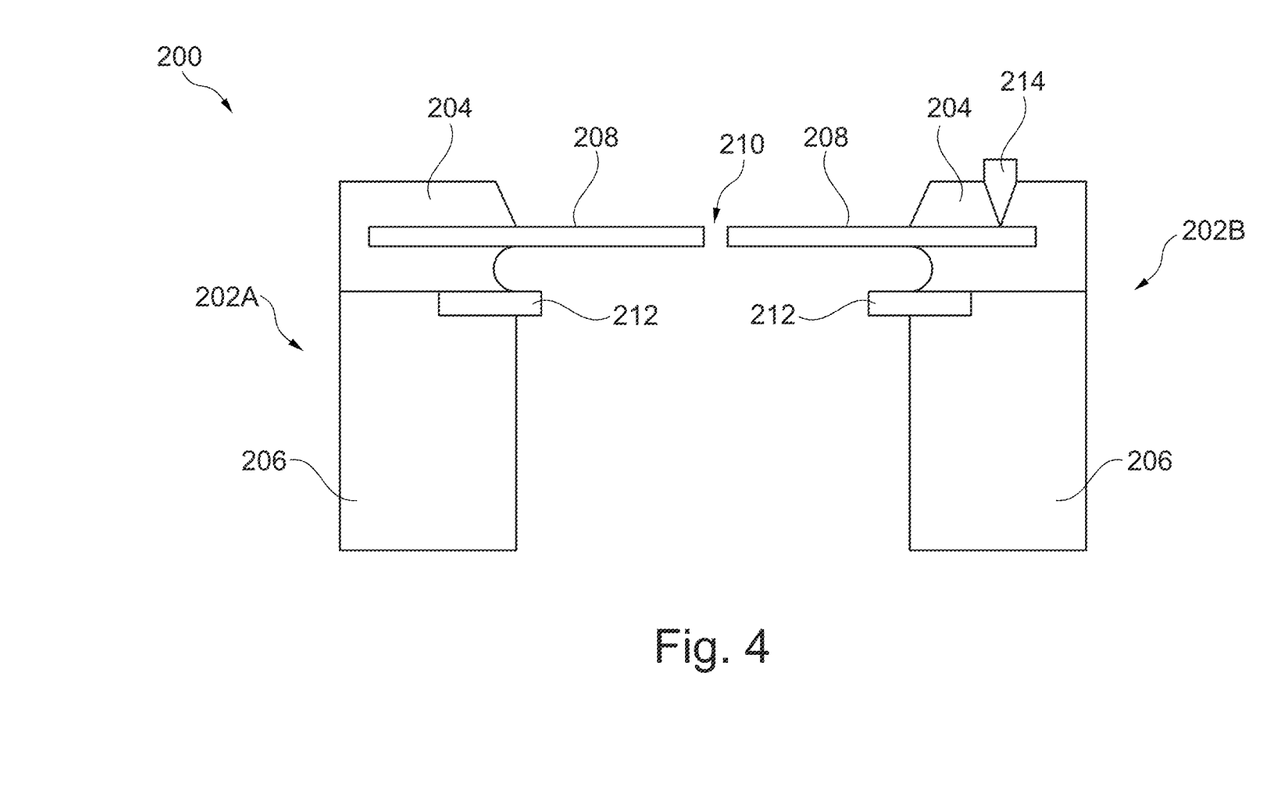
FIG. 4 is a simplified cross-sectional view of a corrugated piezoelectric microphone that can be combined with a corrugated piezoelectric vibration sensor according to an embodiment.

FIG. 4 is a simplified cross-sectional view of a corrugated piezoelectric microphone that can be combined with a corrugated piezoelectric vibration sensor according to an embodiment. In the simplified cross-sectional view of FIG. 4, the corrugations in corrugated piezoelectric membrane 208 are not actually shown for clarity.

Corrugated piezoelectric microphone 200 includes a first holder or mechanical fixture 202A, a second holder or mechanical fixture 202B, a clamping layer 204, bulk silicon portion 206, a corrugated piezoelectric membrane 208, a ventilation hole 210, a membrane defining layer 212, and a contact pad 214. In an embodiment, the clamping layer 204 can comprise a silicon or dielectric layer. In an embodiment, membrane defining layer 212 defines the amount of the membrane that is exposed and can comprise a metal, silicon, or dielectric layer. Other such corrugated piezoelectric microphones can also be used for combining with a corrugated piezoelectric vibration sensor that is shown in FIG. 5 and described below.

Corrugated piezoelectric microphone 200 is used to convert changes in air pressure from above or below corrugated piezoelectric membrane 208 into a corresponding output voltage at contact pad 214. In embodiments, holders 202A and 202B can comprise a bulk silicon portion 206 and a clamping layer 204 disposed over the bulk silicon portion 206, that may comprise one or more silicon or dielectric thin film layers for the purpose of securing end portions of corrugated piezoelectric membrane 208. Ventilation hole 210 is designed to minimize the flow resistance of corrugated piezoelectric membrane 208, and can comprise a pattern of a plurality of ventilation holes 210 in embodiments. For a circular corrugated piezoelectric membrane 208, a circular pattern of ventilation holes 210 can be used. The membrane defining layer 212 can be positioned between the bulk silicon portion 206 and the clamping layer 204 in embodiments and can comprise silicon, dielectric, or metal layers, or combinations of these layers. The purpose of the membrane defining layer 212 is to define an acceptable exposure area of corrugated piezoelectric membrane 208. In certain applications, it may be advantageous to protect the edges of corrugated piezoelectric membrane 208 from direct exposure to changes in air pressure from below in order to protect the structural integrity of membrane 208. The exact lateral extent of membrane defining layer 212 can be changed depending upon the application of corrugated piezoelectric microphone 200. In some embodiments, membrane defining layer 212 is optional and can be eliminated if desired. Contact pad 214 can comprise a metal or metal alloy contact pad formed in an upper portion of clamping layer and in direct contact with an upper surface of corrugated piezoelectric membrane 208 as previously described.

Figure 5:
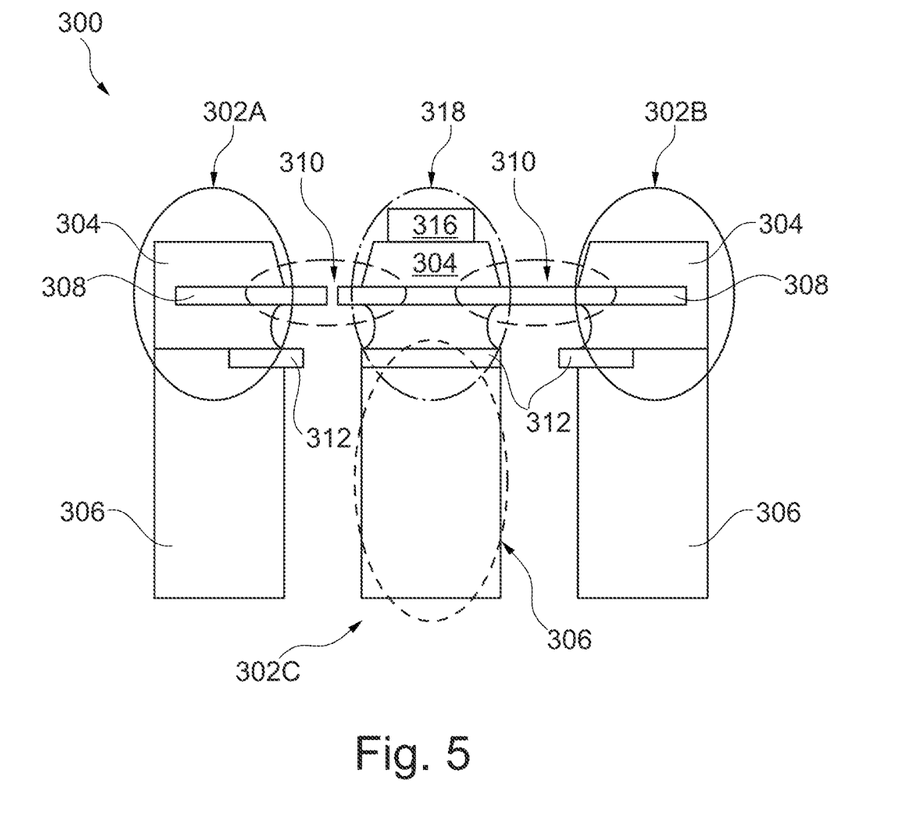
FIG. 5 is a simplified cross-sectional view of a corrugated piezoelectric vibration sensor that can be combined with a corrugated piezoelectric microphone according to an embodiment.

FIG. 5 is a simplified cross-sectional view of a corrugated piezoelectric vibration sensor that can be combined with a corrugated piezoelectric microphone according to an embodiment. In the simplified cross-sectional view of FIG. 5, the corrugations in corrugated piezoelectric membrane 308 are not actually shown for clarity.

Corrugated piezoelectric vibration sensor 300 includes a first holder or mechanical fixture 302A, a second holder or mechanical fixture 302B, an inertial mass 302C, a clamping layer 304, a bulk silicon portion or bulk mass 306, a corrugated piezoelectric membrane 308, a ventilation hole 310, a membrane defining layer 312, a thin film layer 316, and a thin film mass 318. In an embodiment, the clamping layer 304 can comprise a silicon or dielectric layer. In an embodiment, membrane defining layer 312 defines the amount of the membrane that is exposed and can comprise a metal, silicon, or dielectric layer. The thin film layer can comprise a silicon, oxide, dielectric, or metal layer. Other such corrugated vibration sensors can also be used for combining with a corrugated microphone that is shown in FIG. 4 and described above.

As shown in FIG. 5, different layer stacks can be used to provide an inertial mass (proof mass) to the corrugated piezoelectric membrane 308. The inertial mass can comprise bulk mass 306, thin film mass 318, or both. The bulk silicon mass 306 provides the largest mass, which is beneficial to bring down resonance frequency and increase sensitivity of the vibration sensor 300. Thin film mass 318 can include one or more of membrane defining layer 312, clamping layer 304, and thin film layer 316. Thin film mass 318 there can comprise one or more silicon, oxide, dielectric, and/or metal layers. These layers are available in several µm thicknesses directly from the integration of the piezoelectric microphone. However, thin film masses are smaller than the bulk silicon mass. Therefore, in embodiments the combination device may need to be larger to achieve the necessary vibration sensitivity. However, devices with thin film inertial masses may be more robust than devices with bulk silicon inertial masses in some embodiments. By adding an appropriate number of ventilation holes 310 the low-frequency roll-off for pressure coupling can be adjusted up to the kHz range. If further suppression of audio sensitivity of the vibration sensor 300 is needed, a lid may be used to shield the vibration sensor 300 from sound, as is shown in FIGS. 7 and 8 and described in further detail below.

Figure 6:
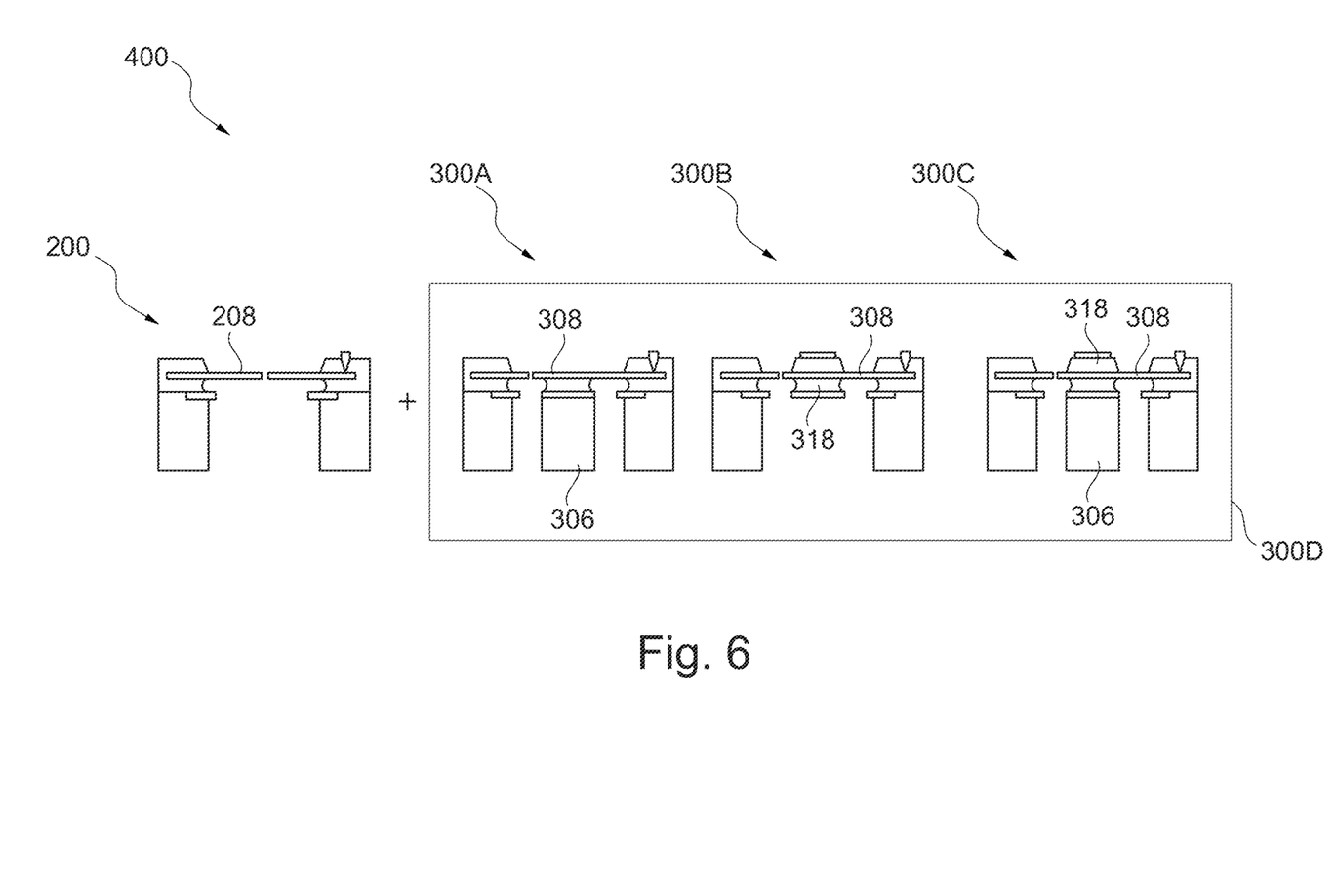
FIG. 6 is a simplified cross-sectional view of a corrugated piezoelectric microphone that can be combined with one or more multiple corrugated piezoelectric vibration sensors according to an embodiment.

FIG. 6 is a simplified cross-sectional view of a corrugated piezoelectric microphone 200 that can be combined with one or more multiple corrugated piezoelectric vibration sensors 300D according to an embodiment to form a combined MEMS structure 400, according to an embodiment. In the simplified cross-sectional view of FIG. 5, the corrugations in corrugated piezoelectric membranes 208 and 308 are not actually shown for clarity. FIG. 6 thus includes a corrugated piezoelectric microphone 200 that is combinable with a selection of corrugated piezoelectric vibration sensors 300D, which in turn includes a first corrugated piezoelectric vibration sensor 300A having a bulk inertial mass 306, a second corrugated piezoelectric vibration sensor 300B having a thin film inertial mass 318, or a third corrugated piezoelectric vibration sensor 300C having a bulk inertial mass 306 and a thin film inertial mass 318. Further details of the combined MEMS structure 400 are described in further detail below with respect to FIGS. 7 and 8.

One or more of the selection of corrugated piezoelectric vibration sensors 300D can be combined with corrugated piezoelectric microphone 200 to form a combined MEMS device, according to embodiments. Any of the vibration sensors may be used and applications may take advantage of the different vibration response characteristics of each of the vibration sensors. A first corrugated piezoelectric vibration sensor 300A comprises a bulk inertial mass 306 coupled to the bottom surface of corrugated piezoelectric membrane 308. Corrugated piezoelectric vibration sensor 300A will have a robust vibration response due to the relatively high mass of bulk inertial mass 306. A second corrugated piezoelectric vibration sensor 300AB comprises a thin film inertial mass 318 coupled to the top and bottom surface of corrugated piezoelectric membrane 308. Corrugated piezoelectric vibration sensor 300B may have a lesser vibration response magnitude due to the relatively low mass of thin film inertial mass 318. Piezoelectric vibration sensor 300B, however, may have a different frequency response than corrugated piezoelectric vibration sensor 300A. Finally, A third corrugated piezoelectric vibration sensor 300C comprises a bulk inertial mass 306 coupled to the bottom surface of corrugated piezoelectric membrane 308 and a thin film inertial mass 318 coupled to the top and bottom surface of corrugated piezoelectric membrane 308. Corrugated piezoelectric vibration sensor 300A will have the maximum vibration response magnitude due to the relatively high mass of bulk inertial mass 306 combined with thin film inertial mass 318.

Figure 7:
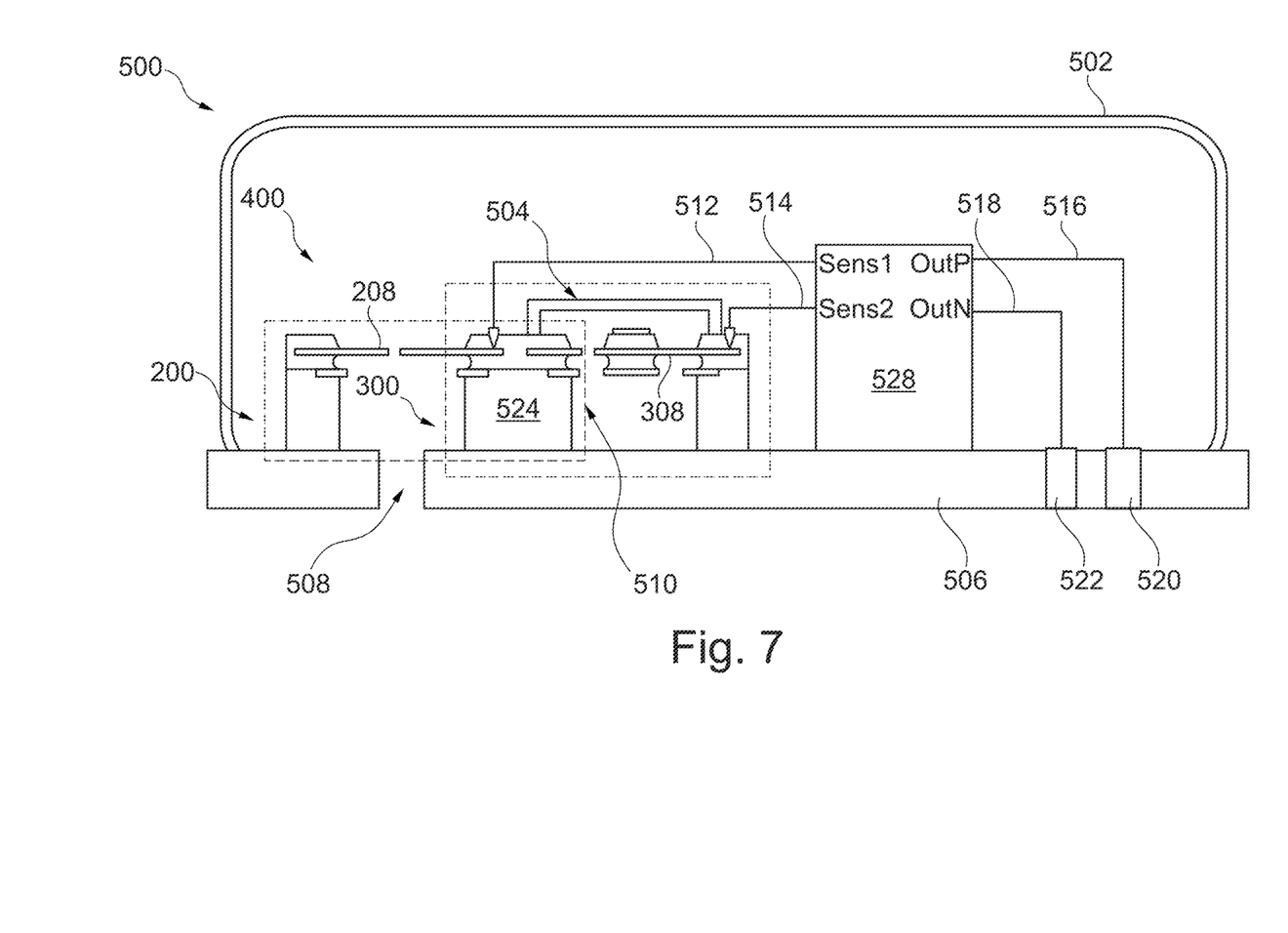
FIG. 7 is a simplified cross-sectional view of a packaged combined corrugated piezoelectric microphone and corrugated piezoelectric vibration sensor according to an embodiment.
Figure 8:
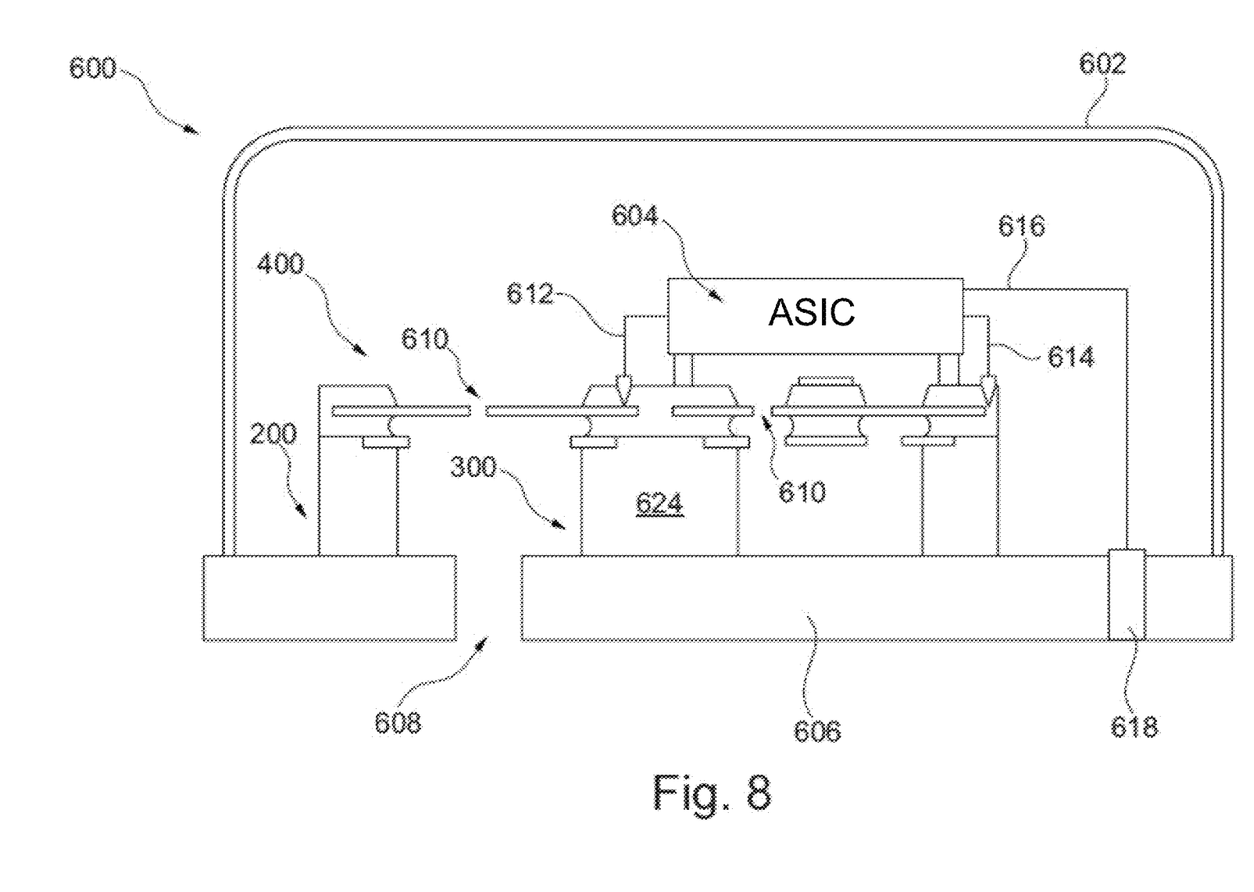
FIG. 8 is a simplified cross-sectional view of a packaged combined corrugated piezoelectric microphone and corrugated piezoelectric vibration sensor according to another embodiment.

FIG. 7 is a simplified cross-sectional view of a packaged combined MEMS structure 500 including the combined MEMS structure 400 including corrugated piezoelectric microphone 200 and corrugated piezoelectric vibration sensor 300 according to an embodiment. In the simplified cross-sectional view of FIG. 5, the corrugations in corrugated piezoelectric membranes 208 and 308 are not actually shown for clarity.

In pertinent part, corrugated piezoelectric microphone 200 and corrugated piezoelectric vibration sensor 300 share a shared holder or mechanical fixture 524 to form the combined MEMS structure 400 in an embodiment. While separate corrugated membranes 208 and 308 are shown in FIG. 7 each affixed to the shared holder 524, a single combined corrugated membrane can include corrugated membranes 208 and 308 as portions of the single combined corrugated membrane extending through shared holder 524 in an embodiment. While vibration sensor 300 is shown as having a thin film inertial mass, a bulk inertial mass, or a combination of both inertial masses can be used. While only one corrugated piezoelectric microphone 200 and one corrugated piezoelectric vibration sensor 300 are combined in FIG. 7, other configurations of microphones and vibration sensors are possible. For example, in an embodiment, one corrugated piezoelectric microphone 200 can be combined with multiple corrugated piezoelectric vibration sensors.

FIG. 7 thus shows a packaged combined MEMS structure 500 including a substrate 506 having a sound port 508. In embodiments, substrate 506 can comprise a dielectric, plastic, fiberglass, or any other suitable material. The packaged combined MEMS structure also includes a housing 502 attached to the substrate 506 enclosing an internal volume including the combined MEMS structure 400, an ASIC 528, and internal wiring between the combined MEMS structure 400 and the ASIC 528. The housing 502 can comprise a metal, or layered metal structure, or a structure including insulating or dielectric and metal layers. Any other suitable materials may also be used in embodiments. In an embodiment a wafer bonded lid 504 or other type of lid can be used if the vibration sensor sensitivity is too high leading to cross-talk caused by audio signals entering through sound port 508 and traversing through microphone 200. Corrugated membrane 308 of the corrugated piezoelectric vibration sensor 300 includes at least one ventilation hole 510. By introducing ventilation holes in the vibration sensor, the low frequency roll-off for pressure response can be shifted up to the single digit kHz range, so that unwanted audio sensitivity below this cut-off frequency can be suppressed without a lid 504 if desired, in an embodiment. The ventilation hole and the lid can be used together in embodiments.

Packaged combined MEMS structure 500 also includes ASIC 528, which can be a differential input and differential output ASIC, in an embodiment. Other custom or generally available amplifier integrated circuits can be used in embodiments. ASIC 528 comprises a first input Sens1 input 512 that is coupled to an output of corrugated piezoelectric microphone 200 and a second input Sens2 514. In an embodiment, inputs 512 and 514 can comprise single-ended inputs of a differential input pair. ASIC 528 comprises a first positive output OutP 516 coupled to microphone signal pad 520 that extends through substrate 506, in an embodiment. Microphone signal pad 520 provides an analog microphone output signal, in an embodiment. ASIC 528 comprises a second negative output OutN 518 coupled to vibration sensor signal pad 522 that extends through 506, in an embodiment. Vibration sensor signal pad 522 provides an analog vibration sensor output signal, in an embodiment.

While an embodiment packaged combined MEMS structure 500 has been shown in FIG. 7, it will be apparent to those skilled in the art that other combinations and placements of the combined MEMS structure, ASIC 528, signal pads 520 and 522, lid 504, and housing 502 can be envisioned. For example, ASIC 528 can include one or more integrated circuits. Housing 502 can be made to enclose additional components, or to enclose only some of the components shown in FIG. 7. Additional signal pads can be used if desired.

FIG. 8 is a simplified cross-sectional view of a packaged combined MEMS structure 600 comprising corrugated piezoelectric microphone 200 and corrugated piezoelectric vibration sensor 300 according to another embodiment. In the simplified cross-sectional view of FIG. 8, the corrugations in combined MEMS structure 400 are not actually shown for clarity.

Packaged combined MEMS structure 600 includes a housing 602, an ASIC 604, a substrate 606, a sound port 608, and a ventilation hole 610 substantially as shown with respect to packaged combined MEMS structure shown in FIG. 7. ASIC 604 includes a microphone signal input 612 coupled to the output of corrugated piezoelectric microphone 200, and a vibration sensor signal input 614 coupled to the output of corrugated piezoelectric vibration sensor 300. Corrugated piezoelectric microphone 200 and corrugated piezoelectric vibration sensor are merged together using shared holder 624 as previously described. ASIC 604 comprises a single output signal 616 coupled to combined MEMS output pad 618. In an embodiment, combined MEMS output pad 618 provides a multiplexed output signal combining the amplified signals on inputs 612 and 614. In an embodiment, combined MEMS structure 400 does not include a lid as previously described, but uses the bottom surface of ASIC 604 instead of a lid. In other words, ASIC 604 provides the amplification functions as well as a shielding function to help isolate corrugated piezoelectric vibration sensor 300 from audio signal inputs through sound port 608 and piezoelectric microphone 200. In FIG. 8, ASIC 604 is shown to be mounted on a top surface of corrugated piezoelectric vibration sensor 300.

Figure 9:
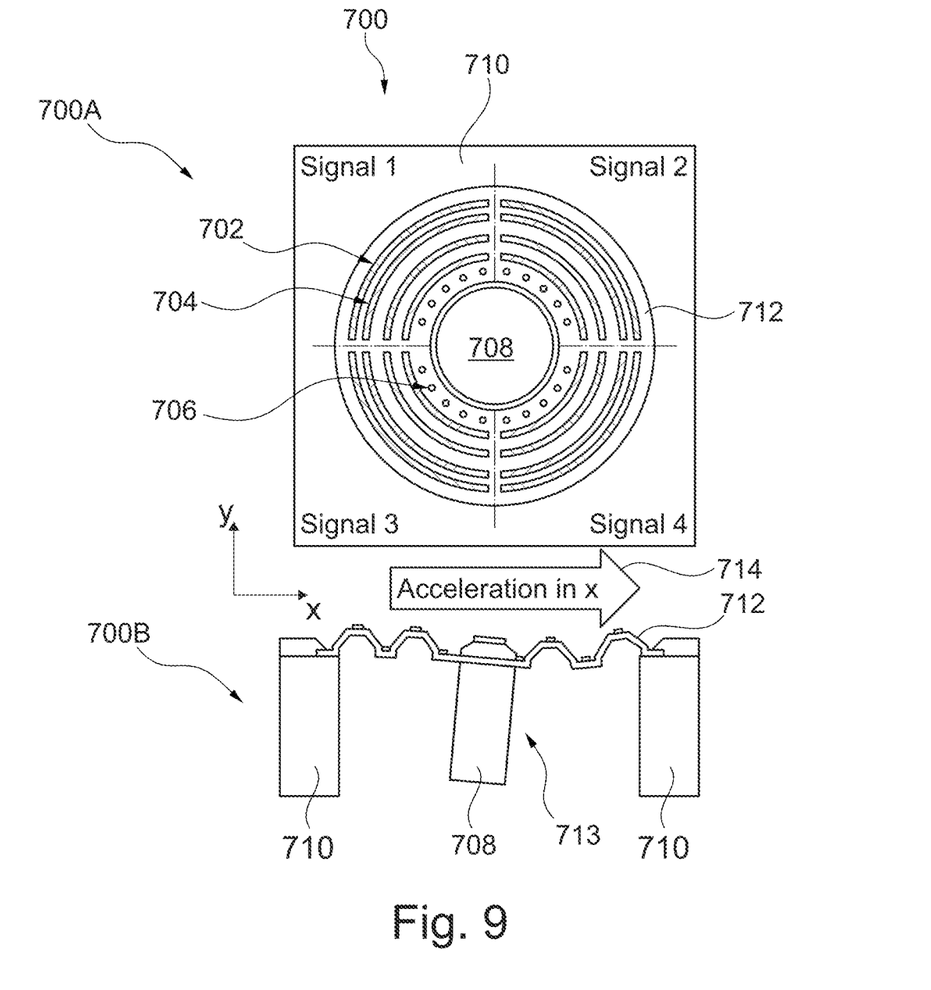
FIG. 9 is plan view and a cross-sectional view of an accelerometer for determining a three-dimensional acceleration direction according to an embodiment.

FIG. 9 is plan view 700A and a cross-sectional view 700B of a corrugated piezoelectric vibration sensor configured as an accelerometer 700 for determining a three-dimensional acceleration direction according to an embodiment. While accelerometer 700 is shown as a standalone component in FIG. 9, it may be combined with a corrugated piezoelectric microphone 200 into a combined MEMS device if desired, as is explained in further detail below.

In various applications it may be required that vibrations are picked up independent of the orientation of the vibration sensor device. A corrugated membrane, particularly in combination with a long bulk silicon inertial mass according to embodiments, will not only react to accelerations perpendicular to its surface (Z-axis), but due to torque acting on the mass it will also sense in-plane acceleration (X-axis and Y-axis). These accelerations can even be disentangled if a multi-segment electrode design is chosen for accelerometer 700 as shown in FIG. 7A and FIG. 7B. In the example of accelerometer 700, four membrane segments are used and described below. While other numbers of membrane segments can be used, the corresponding acceleration equations set forth below may have to be updated to reflect the number of membrane segments chosen for a particular design.

Accelerometer 700 includes a holder 710 that in an embodiment comprises a single holder coupled to a single circular corrugated membrane 712. In other embodiments, multiple individual holders can be used to support corrugated membrane 712. The corrugated membrane 712 has four segments in an embodiment for generating four corresponding signals: Signal 1 (s1), Signal 2, Signal 3 (s3), and Signal 4 (s4). Each membrane segment includes one or more high electrodes 702, and one or more low electrodes 704. A central portion of corrugated membrane 712 comprises a plurality of ventilation holes 706 that can be used to tune the frequency response of accelerometer 700 according to an embodiment. Corrugated membrane 712 is coupled to an inertial mass 708 that includes a bulk silicon portion. The longer the inertial mass, the more torque 713 will be generated in accelerometer for a given acceleration. For thin film layer mass, the output signal for a given acceleration may be considerably smaller. FIG. 9 defines the acceleration direction 714 in the X-axis, wherein the Y-axis direction is orthogonal to the X-axis direction in the plane of FIG. 9, and wherein the Z-axis direction is orthogonal to the X-axis direction extending out from the plane of FIG. 9.

By evaluating sums and differences of the four signals (Signal 1, Signal 2, Signal 3, and Signal 4), acceleration in the X, Y, and Z directions can be calculated.

Acceleration in the X-axis direction is determined by the following equations.

Signal 1=Signal 3

Signal 2=Signal 4

Signal 1≈−Signal 2

Acceleration in the Y-axis direction is determined by the following equations.

Signal 1=Signal 2

Signal 3=Signal 4

Signal 1≈−Signal 3

Acceleration in Z-axis direction is determined by the following equation.

Signal 1=Signal 2=Signal 3=Signal 4

Acceleration signal proportionalities alpha ($\alpha$) and beta ($\beta$) are design specific sensitivities to acceleration conditions and s1 to s4 (the signals from the four corrugated membrane segments) described by the following equations.

$$a_x \propto \alpha(s1+s3-s2-s4)$$

$$a_y \propto \alpha(s1+s2-s3-s4)$$

$$a_z \propto \beta(s1+s3+s2+s4)$$

Accelerometer 700 may be combined with a corrugated piezoelectric microphone 200 into a combined MEMS device if desired by combining one of the edges of holder 710 with one of the holders of corrugated piezoelectric microphone 200, is a single holder 710 is used. If multiple holders 710 are used, accelerometer 700 may combined with a corrugated piezoelectric microphone 200 into a combined MEMS device combining one of the multiple holders 710 with one of the holders of corrugated piezoelectric microphone 200.

Figure 10:
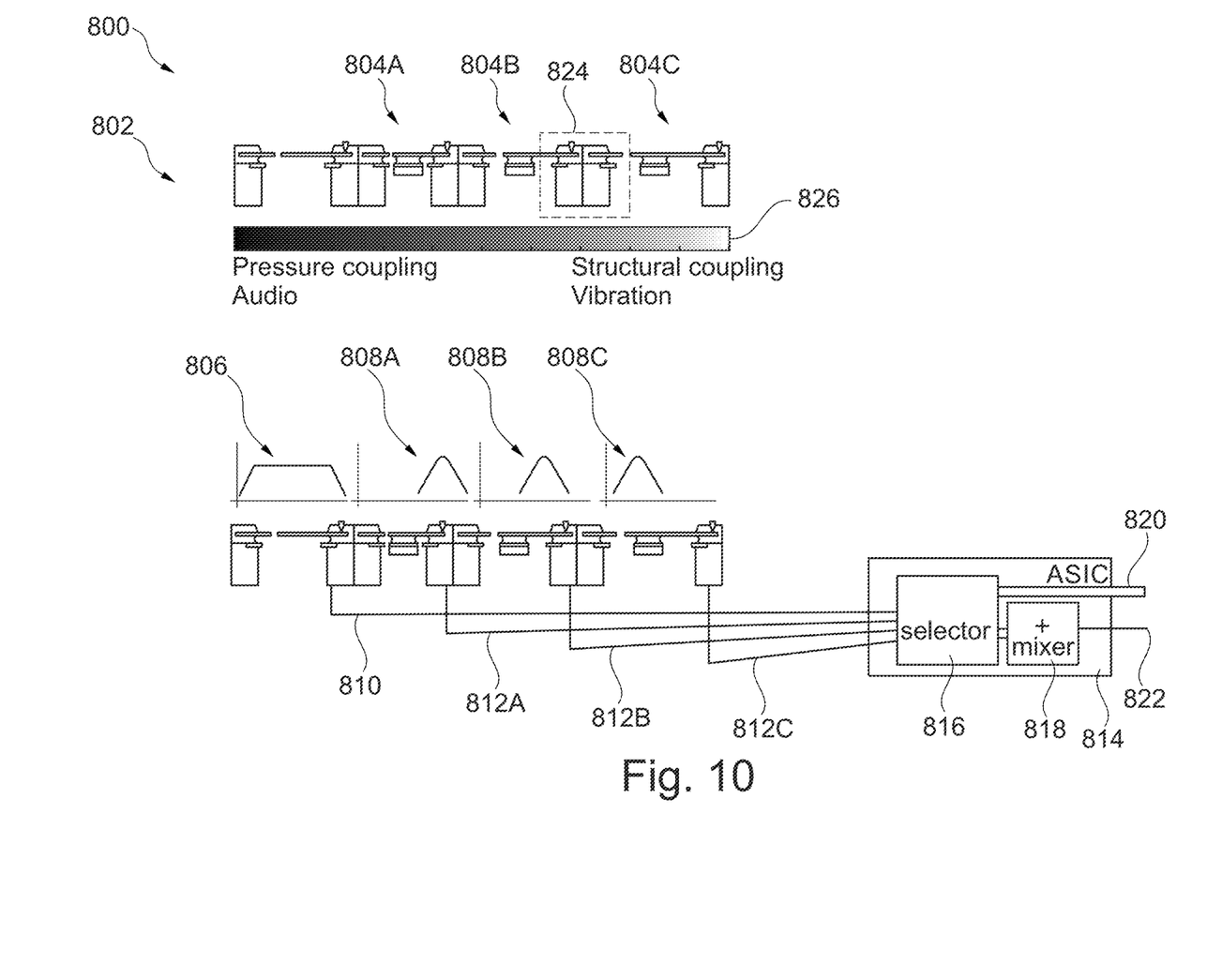
FIG. 10 is a simplified cross-sectional view of a corrugated piezoelectric microphone combined with multiple corrugated piezoelectric vibration sensors having individual resonance frequencies according to an embodiment.

FIG. 10 is a simplified cross-sectional view of a corrugated piezoelectric microphone combined with multiple corrugated piezoelectric vibration sensors having individual resonance frequencies according to an embodiment. In the simplified cross-sectional view of FIG. 10, the corrugations in combined MEMS structure 800 are not actually shown for clarity.

In an embodiment, multiple corrugated piezoelectric vibration sensor devices with different resonance frequencies can be combined with a corrugated piezoelectric microphone. While individual devices can be used, the microphone and vibration sensors can all be coupled together to form a combined MEMS device using shared holders. Individual corrugated membranes can be used, or a single corrugated membrane extending to all of the devices can be used in embodiments. To achieve the different resonance frequencies, inertial masses of different weights can be used, or by shaping lateral corrugation membrane and weight dimensions, or both.

FIG. 10 shows a combined MEMS structure 800 including a corrugated piezoelectric microphone 802, and a plurality of tuned corrugated piezoelectric vibration sensors, including corrugated piezoelectric vibration sensor 804A, corrugated piezoelectric vibration sensor 804B, and corrugated piezoelectric vibration sensor 804C. While three vibration sensors are shown, any number may be used in embodiments. While the corrugated microphone 802, and the corresponding piezoelectric vibration sensors are shown as individual MEMS devices, two or more of these devices can be merged using a merged holder 824 that may be made to be a single holder such as shared holder 524 shown in FIG. 7, or shared holder 624 shown in FIG. 8. FIG. 10 also shows an audible frequency spectrum extending from the higher frequency audio signals from pressure coupling the combined MEMS structure 800 to outside pressure signals to the lower frequency vibration signals from the structural coupling of the combined MEMS structure to the outside environment. FIG. 10 also shows the frequency response of each of the devices in the combined MEMS structure 800 including the corrugated piezoelectric microphone 802 frequency response 806, the corrugated vibration sensor 804A frequency response 808A, the corrugated vibration sensor 804B frequency response 808B, and the corrugated vibration sensor 804C frequency response 808C. An ASIC 814 is used to amplify the signals associated with combined MEMS structure 800. A selector circuit 816 of ASIC 814 includes a corrugated piezoelectric microphone input 810 coupled to corrugated piezoelectric microphone 802, a corrugated vibration sensor input 812A coupled to corrugated piezoelectric vibration sensor 804A, a corrugated vibration sensor input 812B coupled to corrugated piezoelectric vibration sensor 804B, and a corrugated vibration sensor input 812C coupled to corrugated piezoelectric vibration sensor 804C. In an embodiment, mixer circuit 818 can be used to combine the selector outputs at mixer output 822. Selector circuit 816 also includes a selector input 820 for controlling channel selection of selector circuit 816.

In summary, embodiments of a corrugated piezoelectric membrane microphone combined in a package with one or more corrugated piezoelectric membrane based vibration sensors using the same corrugated piezoelectric technology have been shown and described, suitable for usage in various applications including headphones or headset applications.

Example embodiments of the present invention are summarized here. Other embodiments can also be understood from the entirety of the specification and the claims filed herein.

Example 1. According to an embodiment, a combined MEMS structure includes a first piezoelectric membrane comprising one or more first electrodes, the first piezoelectric membrane being affixed between a first holder and a second holder; and a second piezoelectric membrane comprising an inertial mass and one or more second electrodes, the second piezoelectric membrane being affixed between the second holder and a third holder.

Example 2. The combined MEMS structure of Example 1, wherein the first piezoelectric membrane is configured to provide a microphone signal output at the one or more first electrodes, and wherein the second piezoelectric membrane is configured to provide an inertial sensor signal output at the one or more second electrodes.

Example 3. The combined MEMS structure of any of the previous examples, wherein the first piezoelectric membrane and the second piezoelectric membrane comprise a single membrane.

Example 4. The combined MEMS structure of any of the previous examples, wherein at least one of the first piezoelectric membrane and the second piezoelectric membrane comprises a corrugated membrane.

Example 5. The combined MEMS structure of any of the previous examples, wherein the inertial mass comprises a bulk mass.

Example 6. The combined MEMS structure of any of the previous examples, wherein the inertial mass comprises a thin film mass.

Example 7. The combined MEMS structure of any of the previous examples, wherein the inertial mass comprises a bulk mass and a thin film mass.

Example 8. The combined MEMS structure of any of the previous examples, further comprising a plurality of additional piezoelectric membranes configured to provide additional inertial sensor signal outputs.

Example 9. The combined MEMS structure of claim any of the previous examples, wherein the plurality of additional piezoelectric membranes comprises individually tuned membranes each having distinct resonance frequencies.

Example 10. The combined MEMS structure of any of the previous examples, wherein at least one of the plurality of additional piezoelectric membranes comprises a corrugated membrane.

Example 11. According to an embodiment, a packaged MEMS structure includes a substrate including a sound port, and a contact pad; a first piezoelectric membrane comprising one or more first electrodes, the first piezoelectric membrane being affixed between a first holder and a second holder; a second piezoelectric membrane comprising an inertial mass and one or more second electrodes, the second piezoelectric membrane being affixed between the second holder and a third holder, wherein the first, second, and third holders are secured to the substrate; an amplifier having first and second inputs coupled to the one or more first electrodes and the one or more second electrodes and an output coupled to the contact pad; and a housing secured to the substrate, enclosing the first piezoelectric membrane, the second piezoelectric membrane, and the amplifier.

Example 12. The packaged MEMS structure of Example 11, wherein the first piezoelectric membrane is configured to provide a microphone signal output at the one or more first electrodes, and wherein the second piezoelectric membrane is configured to provide an inertial sensor signal output at the one or more second electrodes.

Example 13. The packaged MEMS structure of any of the previous examples, wherein the first piezoelectric membrane and the second piezoelectric membrane comprise a single piezoelectric membrane.

Example 14. The packaged MEMS structure of any of the previous examples, wherein at least one of the first piezoelectric membrane and the second piezoelectric membrane comprises a corrugated membrane.

Example 15. The packaged MEMS structure of any of the previous examples, further comprising a lid over the second piezoelectric membrane, the lid being affixed to the second and third holders.

Example 16. The packaged MEMS structure of any of the previous examples, wherein the amplifier is configured to be over the second piezoelectric membrane, the amplifier being affixed to the second and third holders.

Example 17. The packaged MEMS structure of any of the previous examples, wherein the amplifier comprises a differential input.

Example 18. The packaged MEMS structure of any of the previous examples, wherein the amplifier comprises a differential output coupled to the contact pad and an additional contact pad.

Example 19. The packaged MEMS structure of any of the previous examples, wherein the inertial mass comprises a bulk mass.

Example 20. The packaged MEMS structure of any of the previous examples, wherein the inertial mass comprises a thin film mass.

Example 21. The packaged MEMS structure of any of the previous examples, wherein the inertial mass comprises a bulk mass and a thin film mass.

Example 22. According to an embodiment, a MEMS accelerometer includes a piezoelectric membrane including at least one electrode and an inertial mass, the piezoelectric membrane being affixed to a holder; and a circuit configured for evaluating sums and differences of signals associated with the at least one electrode to determine a three-dimensional acceleration direction.

Example 23. The MEMS accelerometer of Example 22, wherein the piezoelectric membrane comprises a circular membrane.

Example 24. The MEMS accelerometer of any of the previous examples, wherein the piezoelectric membrane comprises a corrugated membrane.

Example 25. The MEMS accelerometer of any of the previous examples, wherein the at least one electrode comprises a segmented electrode.

Example 26. The MEMS accelerometer of any of the previous examples, wherein the segmented electrode comprises four segmentation zones.

Example 27. The MEMS accelerometer of any of the previous examples, wherein the segmented electrode comprises a plurality of high electrode segments and a plurality of low electrode segments.

Example 28. The MEMS accelerometer of any of the previous examples, wherein the piezoelectric membrane comprises a plurality of ventilation holes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A combined MEMS structure comprising:
a substrate including a sound port configured to receive acoustic signals;
a first piezoelectric membrane configured to receive the acoustic signals from the sound port and comprising one or more first electrodes, the first piezoelectric membrane being affixed between a first holder and a second holder;
a second piezoelectric membrane comprising an inertial mass and one or more second electrodes, the second piezoelectric membrane being affixed between the second holder and a third holder;
a plurality of additional piezoelectric membranes configured to provide additional inertial sensor signal outputs;
a housing secured to the substrate and enclosing the first piezoelectric membrane and the second piezoelectric membrane;
an integrated circuit positioned within the housing and configured to isolate the second piezoelectric membrane from the acoustic signals received through the sound port; and
a selector circuit coupled to the first piezoelectric membrane, the second piezoelectric membrane, and the plurality of additional piezoelectric membranes, the selector circuit configured to selectively output signals received from the first piezoelectric membrane, the second piezoelectric membrane, and the plurality of additional piezoelectric membranes.

2. The combined MEMS structure of claim 1, wherein the first piezoelectric membrane is configured to provide a microphone signal output at the one or more first electrodes, and wherein the second piezoelectric membrane is configured to provide an inertial sensor signal output at the one or more second electrodes.

3. The combined MEMS structure of claim 1, wherein the first piezoelectric membrane and the second piezoelectric membrane comprise a single membrane.

4. The combined MEMS structure of claim 1, wherein at least one of the first piezoelectric membrane and the second piezoelectric membrane comprises a corrugated membrane.

5. The combined MEMS structure of claim 1, wherein the inertial mass comprises a bulk mass.

6. The combined MEMS structure of claim 1, wherein the inertial mass comprises a thin film mass.

7. The combined MEMS structure of claim 1, wherein the inertial mass comprises a bulk mass and a thin film mass.

8. The combined MEMS structure of claim 1, further comprising a mixer circuit configured to combine the signals selectively output by the selector circuit.

9. The combined MEMS structure of claim 1, wherein the plurality of additional piezoelectric membranes comprises individually tuned membranes each having distinct resonance frequencies.

10. The combined MEMS structure of claim 1, wherein at least one of the plurality of additional piezoelectric membranes comprises a corrugated membrane.

11. A packaged MEMS structure comprising:
a substrate comprising a sound port and a contact pad;
a first piezoelectric membrane comprising one or more first electrodes, the first piezoelectric membrane being affixed between a first holder and a second holder;
a second piezoelectric membrane comprising an inertial mass and one or more second electrodes, the second piezoelectric membrane being affixed between the second holder and a third holder, wherein the first, second, and third holders are secured to the substrate;
a plurality of additional piezoelectric membranes configured to provide inertial sensor signal outputs;
an amplifier having first and second inputs coupled to the one or more first electrodes and the one or more second electrodes and an output coupled to the contact pad; and a selector circuit coupled to the first piezoelectric membrane, the second piezoelectric membrane, and the plurality of additional piezoelectric membranes, the selector circuit configured to selectively output signals received from the first piezoelectric membrane, the second piezoelectric membrane, and the plurality of additional piezoelectric membranes; and a housing secured to the substrate, enclosing the first piezoelectric membrane, the second piezoelectric membrane, the plurality of additional piezoelectric membranes, and the amplifier, the amplifier positioned in the housing to shield the second piezoelectric membrane from acoustic signals input to the housing through the sound port.

12. The packaged MEMS structure of claim 11, wherein the first piezoelectric membrane is configured to provide a microphone signal output at the one or more first electrodes, and wherein the second piezoelectric membrane is configured to provide an inertial sensor signal output at the one or more second electrodes.

13. The packaged MEMS structure of claim 11, wherein the first piezoelectric membrane and the second piezoelectric membrane comprise a single piezoelectric membrane.

14. The packaged MEMS structure of claim 11, wherein at least one of the first piezoelectric membrane and the second piezoelectric membrane comprises a corrugated membrane.

15. The packaged MEMS structure of claim 11, further comprising a lid over the second piezoelectric membrane, the lid being affixed to the second and third holders.

16. The packaged MEMS structure of claim 11, wherein the amplifier is configured to be over the second piezoelectric membrane, the amplifier being affixed to the second and third holders.

17. The packaged MEMS structure of claim 11, wherein the amplifier comprises a differential input.

18. The packaged MEMS structure of claim 11, wherein the amplifier comprises a differential output coupled to the contact pad and an additional contact pad.

19. The packaged MEMS structure of claim 11, wherein the inertial mass comprises a bulk mass.

20. The packaged MEMS structure of claim 11, wherein the inertial mass comprises a thin film mass.

21. The packaged MEMS structure of claim 11, wherein the inertial mass comprises a bulk mass and a thin film mass.

* * * * *